United States Patent [19]

Doerig

[11] 4,079,335

[45] Mar. 14, 1978

[54] ADAPTIVE LEVEL CONTROL FOR ELECTRO-ACOUSTO DEVICE

[75] Inventor: Franz Doerig, Yverdon, Switzerland

[73] Assignee: Bolex International SA, Ste-Croix, Switzerland

[21] Appl. No.: 739,011

[22] Filed: Nov. 4, 1976

[30] Foreign Application Priority Data

Nov. 6, 1975 Switzerland .................. 14471/75

[51] Int. Cl.² ............................................. H03G 3/30
[52] U.S. Cl. ................................. 330/281; 179/1 VL;
330/51; 330/59; 330/141; 330/145; 330/207 R
[58] Field of Search ................ 330/29, 51, 141, 145

[56] References Cited

U.S. PATENT DOCUMENTS

| 3,790,896 | 2/1974 | Shimizu et al. ........................ 330/29 |
| 3,992,677 | 11/1976 | Tsurushima ........................... 330/29 |

FOREIGN PATENT DOCUMENTS

| 2,401,875 | 7/1975 | Germany. |
| 2,336,014 | 1/1975 | Germany. |
| 2,407,564 | 8/1975 | Germany. |

*Primary Examiner*—Lawrence J. Dahl
*Attorney, Agent, or Firm*—Fleit & Jacobson

[57] ABSTRACT

A circuit for providing adaptive level control in a sound-recording device. A feed-back signal drives a variable attenuator which controls the input level to the audio amplifier stage. Means are provided for preventing voltage spikes at turn-on from adversely affecting the operation of the attenuator and which provide stable sensitivity control.

3 Claims, 3 Drawing Figures

4,079,335

ADAPTIVE LEVEL CONTROL FOR ELECTRO-ACOUSTO DEVICE

BACKGROUND OF THE INVENTION

The present invention is concerned with a circuit for use with electro-acoustic devices, such as sound-film devices, magnetic tape instruments, or similar devices with an audio amplifier connected to a signal source wherein an automatic control stage is used to control the amplifier's sensitivity.

In such devices, when the operating voltage is applied to the electronic circuits employed, asymmetric circuits, or unbalanced, unmatched components, can trigger voltage peaks in the amplifier that affect the automatic sensitivity adjustment of the amplifier adversely. Such automatic sensitivity adjustments are used in the independent tone control of many electro-acoustic devices in order to systematically achieve optimum conditions in modulating additional electronic devices when the input signals are of varying magnitude. For example, similar devices to control input sensitivity may be found in amplifying systems wherein signals are supplied by the pick-up device of a sound recorder to the output stage of the amplifier which is being used in order to maintain an audio level adequate for filling a room with sound and hence to provide an optimum sound recording.

Similarly, such circuits find significant use in the case of direct-sound motion picture cameras; wherein the adjustment of the sound signal to be recorded must be achieved instantly upon commencing operation. This is especially true in such case since, if a qualitatively unfavorable sound recording has been made it will hardly be possible to repeat the recording at a reasonable cost. Interferences occurring when the operation of the device is started can, in some cases, affect the automatic oscillator stage which is used to perform the adjustment of the sensitivity of the amplifier in such a way that the storage of the sound signals, particularly from the start of storage, is either to faint or too loud. Since the automatic sensitivity adjusting devices always have adjustment features determined by relatively large time constants, an adverse effect may occur; that is, from the start of a sound recording on, over a relatively long period of time, storage of the sound signals will be inadequate. Customarily, time constants in this type of adjusting devices are usually of such size that large input signals rapidly bring about a drop in the amplifier output level, and the sensitivity setting will then be maintained over a relatively long period of time.

It is therefore an object of the present invention to provide a circuit which avoids the drawbacks of known devices and does not require the user to handle any additional devices.

SUMMARY OF THE INVENTION

For these reasons, in accordance with the present invention, a switching design is provided for use in a circuit of the above type that adjusts the amplifier sensitivity to a certain value whenever the electro-acoustic device is started. The present invention achieves this in a relatively simple way by providing that, from the moment of the beginning of the transmission of the signal, the audio amplifier is fed only signals whose quality has not been adversley affected by interference. If, by means of design measures of circuit organization, the amplifier is always adjusted to a high sensitivity when the operation of the device is started, and if the characteristic features of the adjustment of sensitivity are chosen in such a way that large input signals at the amplifier input rapidly result in a drop in the amplifier's sensitivity, then an output signal may be produced practically without any delay, from the start of the operation by the amplifier having the amplitude required for proper recording.

DETAILED DESCRIPTION OF THE PREFERRED EMBODIMENT

Figure 1:
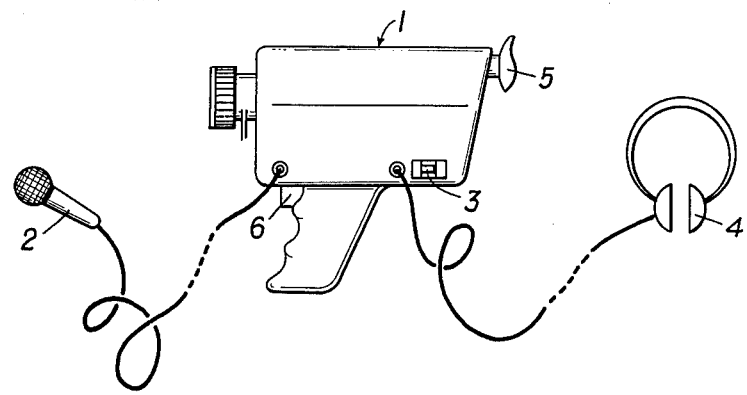
FIG. 1 is a plan view of a direct sound-recording motion picture camera.

Referring now to the drawings, FIG. 1 shows a motion-picture camera 1 suitable for films having thereon a magnetic track for the recording of acoustics or audio at the time the film is being exposed. To that end, a microphone 2 is connected with one of the camera's electric circuits which would benefit from the present invention. Such electric circuits involve essentially a audio frequency amplifier with an automatic modulating stage, a recording head adjacent to the magnetic track of the motion picture film, and a high-frequency generator for the pre-magnetization of the magnetic track. These components are switched on by main switch 3. In operation, it will be possible for the user of camera 1 to hear the signals picked up by the microphone 2 by way of a head set 4. With the aid of a view-finder 5 on the camera 1, it is possible to look at the subject of the picture to be taken, as well as, to view a small indicator light that indicates the extent of the depth of modulation factor of the recording equipment. However, in place of a small indicator light, it is also possible to use a luminous diode, a linear scale, or an electromechanical measuring instrument that is also visible in the view-finder. Conventionally, when a release trigger 6 is actuated, the film will be moved, the picture will be taken, and the sound will be recorded.

Figure 2:
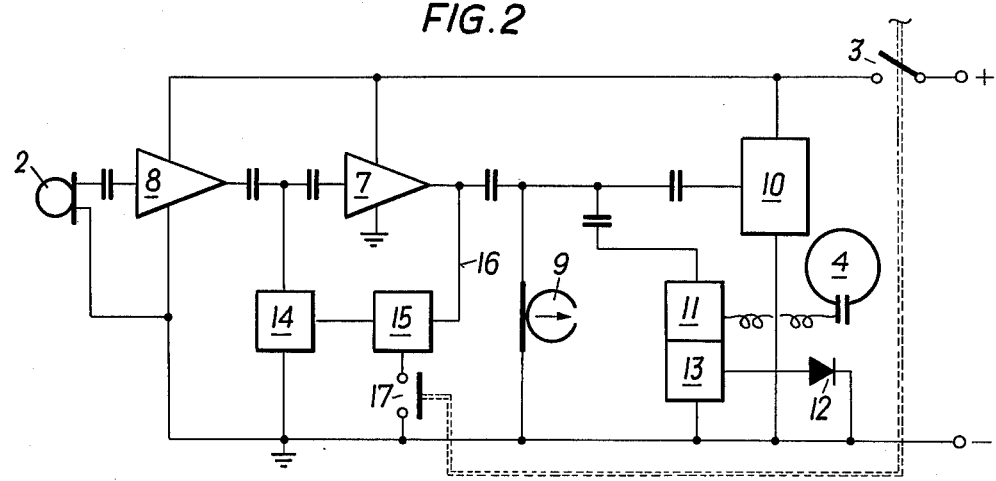
FIG. 2 is a schematic diagram of the preferred embodiment of the present invention in block diagram form.

To prevent any failures of the automatic modulating stage following the activation of main switch 3, the circuit in FIG. 2 in accordance with the present invention has been provided. Referring not to the schematic diagram of FIG. 2, the microphone 2 is connected to the input of pre-amplifier 8 whose output is connected to the input of amplifier 7. The recording head 9, which is assigned to the magnetic track already applied to the motion-picture film of the motion-picture camera in accordance with FIG. 1, is connected with the output of amplifier 7. A high-frequency generator 10 supplies the high-frequency voltage required for pre-control through head-set amplifier 11. The luminous diode 12 is driven by the output of amplifier 7 after having its level raised sufficiently by amplifier 13 and is used to monitor visually the amplifier's output signals as described above.

In order to perform the sensitivity adjustment of amplifier 7, an adjustable attenuator 14 is connected across its input; attenuator 14 is controlled by control stage 15. A signal derived from the output signal of amplifier 7 is converted in the control stage 15, into a direct current signal which is then used to attenuate the input signal to amplifier 7 by means of the attenuator.

The adjustment of the sensitivity of amplifier 7 occurs as follows: a large output signal at the output of amplifier 7 brings about a considerable attenuation of the input signal (a reduction of the sensitivity of amplifier 7). On the other hand, a small output signal of amplifier 7 brings about a lesser attenuation of the input signal (an increase in the sensitivity of amplifier 7). With these measures, automatically, at all times, a signal having roughly the same volume can be picked up from the output of amplifier 7 and supplied to other electronic equipment, even with input signals of varying level or volume. Because of its connection with time-constant components, control stage 15 can supply a control signal to attenuator 14; in turn, it activates attenuator 14 even when no signal is present, or when only a small signal is supplied by the output of amplifier 7.

It is possible that voltage peaks may appear while the operation of the device is started by closing the main switch 3. Such peaks may be caused by asymmetries or unmatched components in the device's electronic equipment. These voltage peaks will have the effect of charging the timing element of the control stage 15 and thereby activating attenuator 14. The setting of the attenuator is then maintained constant for a certain period of time, due to the storage effect of the timing element and faint acoustic events received from the microphone will not be amplified by the amplifier 7 in the way desired, thereby producing a qualitatively poor sound recording. To prevent trouble of this type, a sender-key contact 17 has been provided, as shown in FIG. 2, which discharges the timing element provided in control stage 15 without any delay, and thereby assures that the operation of attenuator 14 will not begin immediately and, therefore, no attenuation of the input signal of amplifier 7 will take place. Moreover, a small signal that may perhaps appear on the input of amplifier 7, will be amplified considerably in the right direction. On the other hand, a large input signal brings about, by way of the automatic volume-control potential resulting from said signal, a matching attenuation, on the output control stage 15, to the signal level desired on the output of the amplifier 7. To effect such operation, the sender-key contact 17 is coupled mechanically with the main switch 3 of the device, in such a way that it will be closed only for a short time, during the actuation of main switch 3, in other words, the shorting contacts 17 may be a momentary contact switch. A trigger cam could be connected with the handle of main switch 3, in a manner not shown, with the trigger cam controlling the sender-key contact 17.

Figure 3:
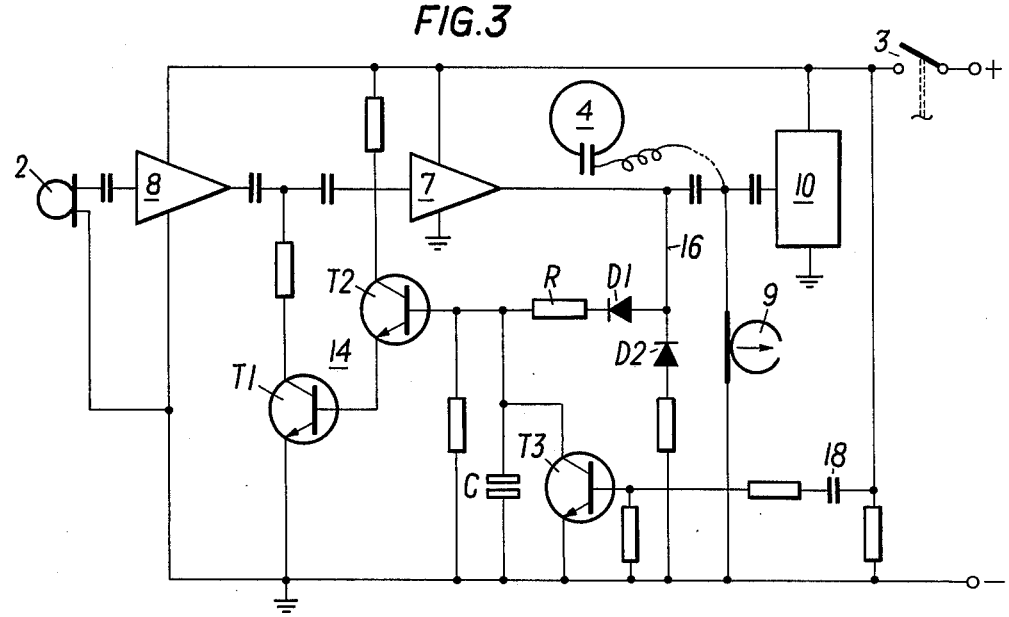
FIG. 3 is a schematic diagram of the circuit of the present invention showing the circuit elements.

Referring now to FIG. 3, the attenuator 14 consists of the Darlington-type transistor amplifier stage T1, T2. The variable resistance formed by the collector-emitter stage of transistor T1 couples the input of the amplifier 7, more or less, with the ground potential, whereby the input signal of amplifier 7 may be attenuated. The alternating-current voltage from the output of amplifier 7 is fed to diodes D1, D2, in such a way that the positive half-waves of the alternating-current voltage are supplied to storage condenser C. Diode D2 diverts the negative half-waves of the alternate-current voltage to the negative power line which is also ground. The magnitude of the voltage on the condenser C (which together with resistance R forms a timing element) determines the turn-on aperture of Darlington stages T1, T2 and/or the extent of the attenuation of the input signal of amplifier 7.

Since, as mentioned above, voltage peaks brought about by the circuit configuration and occurring when the device is switched on, could cause a charge on condenser C and entail an undesirable attenuation of the input signal, transistor T3 is placed into a conductive state for a brief period of time when the device is switched on, by means of main switch 3, so that the charge of condenser C flows off against the ground connection. To that end, the base of a transistor T3 is connected to one side of main switch 3, by way of condenser 18, so that the rush of the starting current on main switch 3 causes an impulse fed to the base of transistor T3. Following the closing of main switch 3, timing elements R and C will be discharged, and transistor T1 will not be conductive, so that no attenuation of the input signal 7 will occur. Thereafter, when acoustic events take place tht bring about varying signal amplitudes at the microphone 2, the signal regulation will take place according to the principles as described above.

The present invention is not limited to use with motion-picture cameras, it may also be applied to magnetic tape recorders, sound film projectors, transmission equipment, or the like.

We claim:

1. A circuit for use with an electro-acoustic device of the type having a main switching device and an audio amplifier fed by a signal source and a variable attenuator connected to the input of said audio amplifier for the control of the amplifier's sensitivity comprising; an automatic control stage having an input signal derived from the output signal of the amplifier and utilizing at least one time constant element for producing a control signal having a predetermined at-rest value which is fed to said variable attenuator for controlling the sensitivity of said audio amplifier, and switching means connected to said automatic control stage and said main switching device for discharging the time constant element upon actuation of said main switch to automatically adjust the sensitivity of said amplifier to a predetermined level.

2. The circuit in accordance with claim 1, wherein said switching means comprises switch contacts mechanically connected with said main switching device of the electro-acoustic for actuation therewith.

3. The circuit in accordance with claim 1, wherein said switching means comprises the collector-emitter stage of a transistor wherein the base input is electrically connected with the main switching device of the electro-acoustic device by way of a condenser such that direct-current voltage may be applied to the output of the switching means as operating current for discharging said time constant element.

* * * * *